United States Patent [19]
Roehl et al.

[11] Patent Number: 5,073,515
[45] Date of Patent: Dec. 17, 1991

[54] METHOD FOR MANUFACTURING A TRENCH CAPACITOR OF A ONE-TRANSISTOR MEMORY CELL IN A SEMICONDUCTOR SUBSTRATE WITH A SELF-ALIGNED CAPACITOR PLATE ELECTRODE

[75] Inventors: Siegfried Roehl, Sauerlach; Josef Mathuni, Munich, both of Fed. Rep. of Germany

[73] Assignee: Siemens Aktiengesellschaft, Munich, Fed. Rep. of Germany

[21] Appl. No.: 572,262

[22] Filed: Aug. 27, 1990

[30] Foreign Application Priority Data

Sep. 29, 1989 [DE] Fed. Rep. of Germany ....... 3932683

[51] Int. Cl.⁵ ............................................. H01L 21/70
[52] U.S. Cl. .................................... 437/52; 437/47; 437/48; 437/60; 437/919
[58] Field of Search .................... 437/47, 51, 52, 60, 437/61, 69, 193, 195, 200, 203, 228, 233, 235; 357/23.6, 51; 365/174

[56] References Cited

U.S. PATENT DOCUMENTS

| 4,045,783 | 8/1977 | Harland | 357/23.6 |
| 4,752,819 | 6/1988 | Koyama | 357/23.6 |

FOREIGN PATENT DOCUMENTS

| 0187596 | 7/1986 | European Pat. Off. | |
| 3414057 | 10/1984 | Fed. Rep. of Germany | |
| 3837762 | 5/1989 | Fed. Rep. of Germany | |
| 0121080 | 9/1979 | Japan | 357/23.6 |
| 0191374 | 10/1984 | Japan | 357/23.6 |
| 0005572 | 1/1986 | Japan | 357/23.6 |
| 0166157 | 1/1986 | Japan | 357/23.6 |

OTHER PUBLICATIONS

"Isolation Merged Stacked Dynamic Random Access Memory Cell", IBM Technical Disclosure Bulletin, vol. 31, No. 7, Dec. 1988, pp. 39–42.
"Methods of Preventing Excessive Oxidation of Polysilicon Trench Fill in Semiconductor Devices", IBM Technical Disclosure Bulletin, vol. 30, No. 10, Mar. 1988, pp. 156–158.
"An Experimental 16Mbit CMOS DRAM Chip with a 100 MHZ Serial Read/Write Mode", by Shigeyoshi Watanabe et al., IEEE Journal of Solid-State Circuits, vol. 24, No. 3, Jun. 1982, pp. 763–768.
"A Double Epitaxial Process for High Density DRAM Trench Capacitor Isolation", by Chen et al., IEEE Electron Device Letters, vol. Edl. 8, No. 11, Nov. 1987.
"Technologie Hochintegrierter Schaltungen", by D. Widmann et al., Springer–Verlag, pp. 270–271.

Primary Examiner—Brian E. Hearn
Assistant Examiner—Tom Thomas
Attorney, Agent, or Firm—Hill, Van Santen, Steadman & Simpson

[57] ABSTRACT

Method for manufacturing a trench capacitor of a one-transistor memory cell in a semiconductor substrate with a self-aligned cooperating capacitor electrode. In a one-transistor memory cell having a trench capacitor in a semiconductor substrate (1), a field oxide (3) that isolates different cells is exploited for a self-aligning process. After the formation of a first electrode and of a dielectrode (5) of the capacitor, a conductive layer (6) is applied surface-wide, the upper edge thereof being higher over the field oxide (3) than over the field-oxide-free locations of the substrate (1). The raised location is exposed in a re-etching process upon employment of a planarizing auxiliary layer (9), and a sub-layer (10, 10') is selectively applied thereon, either by local oxidation, selective or non-selective deposition. This sub-layer (10, 10') serves as a self-aligned mask for the structuring of the conductive layer (6) as a cooperating electrode of the trench capacitor.

33 Claims, 3 Drawing Sheets

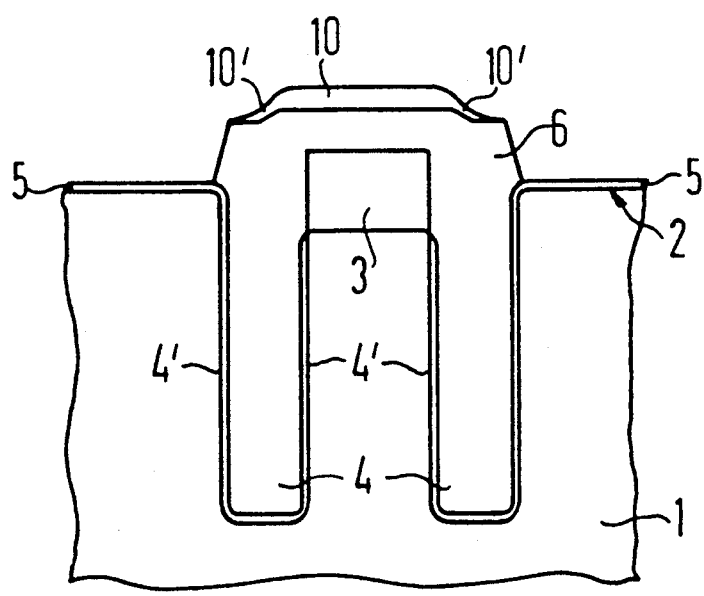
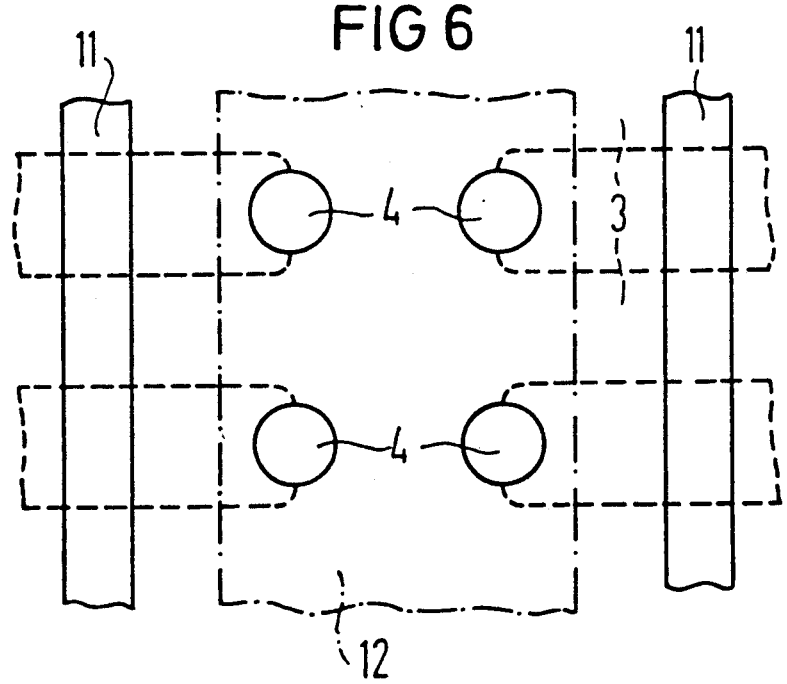

METHOD FOR MANUFACTURING A TRENCH CAPACITOR OF A ONE-TRANSISTOR MEMORY CELL IN A SEMICONDUCTOR SUBSTRATE WITH A SELF-ALIGNED CAPACITOR PLATE ELECTRODE

BACKGROUND OF THE INVENTION

The present invention is directed to a method for manufacturing a trench capacitor of a one-transistor memory cell in a semiconductor substrate that is arranged overlapping relative to an insulating field oxide.

One-transistor memory cells utilized for VLSI semiconductor circuits have capacitors for storing information, these capacitors being fashioned as trench capacitors in a semiconductor substrate of, for example, silicon for minimizing the space requirement. A conventional embodiment of such trench capacitors is known from the book by Widmann, Mader and Friedrich, "Technologie hochintegrierter Schaltungen", Springer-Verlag 88, page 270 and is also disclosed by European reference EPA 0 187 596 in the embodiment referred to as "stacked trench capacitor (STT)". A first electrode of the trench capacitor is formed either by the substrate that is locally re-doped for this purpose (conventional trench capacitor) or is formed by a conductive layer located on the inside trench wall (STT). The second or capacitor plate electrode is formed by a conductive layer with which the trench is filled after the first electrode has been clad with a dielectric layer. For further reducing the space requirement, it is also proposed in European reference EPA 0 187 596 to arrange the trench overlapping with respect to an insulating field oxide that insulates the individual cells of a semiconductor memory arrangement and partially covers the semiconductor surface and, in particular, to etch the trench into the substrate through the edge region of the field oxide.

Given such trench capacitors, the conductive layer that is usually composed of polycrystalline silicon and from which the capacitor plate electrode is formed must be structured using a phototechnique, i.e. must be in turn locally removed with, for instance, a dry etching process. The adjustment precision connected with the phototechnique impedes an arbitrary reduction in the space occupied by the capacitor, so that the integration density of such memory cells cannot be further increased.

SUMMARY OF THE INVENTION

It is therefore an object of the present invention to provide a method for manufacturing a trench capacitor of a one-transistor memory cell that is arranged overlapping relative to an insulating field oxide, whereby the method step that forms the capacitor plate electrode provides a further increase in the integration density.

This object is achieved by a method according to the present invention for manufacturing a trench capacitor of a one-transistor memory cell in a semiconductor substrate. The method comprises the following steps: forming a trench overlapping with a field oxide that isolates various cells and forming a first capacitor electrode of the trench capacitor; manufacturing a first layer on a surface of the semiconductor substrate and on a surface of the first capacitor electrode; applying a second layer on the first layer and on the field oxide; applying at least a third layer on the second layer and applying a leveling auxiliary layer thereon; removing the auxiliary layer at least until parts of the third layer are exposed; removing this exposed part of the third layer at least until parts of the surface of the second layer are exposed and completely removing the auxiliary layer; to produce a sacrificial layer at least on the exposed part of the remaining surface of the second layer; completely removing the layers still situated on the surface of the second layer with the exception of the sacrificial layer; and structuring the second layer using the sacrificial layer as a mask to form a capacitor plate electrode.

In the method of the present invention a thermal or deposited silicon oxide can be used as the first layer. Also, a double or triple layer composed of silicon oxide and silicon nitride as constituents can be used as the first layer. A doped polycrystalline silicon layer can be used as the second layer. A thermal or deposited silicon oxide can be used as the third layer. A photoresist layer or a polyimide layer can be used as the leveling auxiliary layer. The structuring of the second layer can be implemented using an essentially anisotropic etching process, such as an anisotropic etching process having a polymerizing gas additive.

The method of the present invention has the further step of, after the sacrificial layer is reduced, applying a phototechnique layer that covers at least the location of the capacitor plate electrode with resist to remove opposed parts of the sacrificial layer above the field oxide. A fourth layer can be deposited on the third layer and silicon nitride or silicon oxynitride can be used as the fourth layer. The fourth and third layers are anisotropically and selectively etched relative to the second layer after the partial removal of the auxiliary layer that exposes at least parts of the underlying fourth layer.

A silicon oxide layer produced by thermal oxidation can be used as the sacrificial layer and the lateral expanse of the sacrificial layer can be set by thermal oxidation. The sacrificial layer can be produced by selective deposition of polycrystalline silicon, of a refractory metal or of a metal silicide on the second layer. The sacrificial layer layer can also be produced by selective epitaxy of polycrystalline silicon on the second layer. The sacrificial layer can also be produced by surface-wide deposition of silicide-forming metals and by a subsequent silicidation process.

The invention achieves the object by utilizing what is referred to as a self-aligning method. This refers to a method wherein the desired structuring occurs without the use of a phototechnique, i.e. without a photoresist layer exposed and developed with the desired mask, but instead utilizes properties of the surface of the semiconductor substrate that are present before this method step and is processed to such extent. These properties must be locally different on the substrate surface; among other things, they can be of a geometrical nature (height differences) or of a chemical or physical nature. In addition to the afore-mentioned possibility of higher packing density, the elimination of a phototechnique results in a simplification of the method execution.

A further advantage of the method of the present invention is that the position of the capacitor plate electrode can be precisely defined and the reproducability thereof is not restricted by adjustment tolerances. In particular, the edge of the capacitor plate electrode can be placed extremely close to the trench edge, and as a result a following, standard capacitor terminal implantation that assures the connection of the first electrode of the capacitor to a selection transistor can be implemented very easily or, respectively, simultaneously with a source/drain implantation or LDD lightly doped drain) implantation. A separate capacitor terminal implantation plane can be eliminated.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

FIGS. 1-5 are each a cross-section through two trench capacitors of neighboring memory cells shown in a schematic illustration at which the steps of an embodiment of the method are illustrated; and FIG. 6 is a plan view of the memory matrix having an advantageous, geometrical arrangement of the memory cells.

DESCRIPTION OF THE PREFERRED EMBODIMENT

Figure 1:
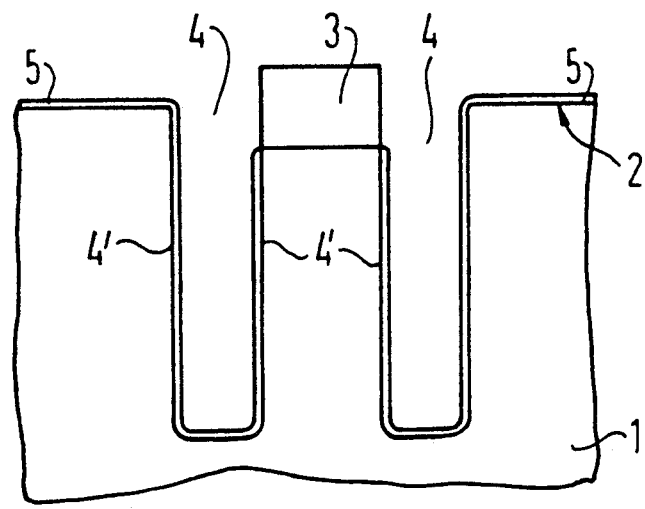

According to FIG. 1, the surface 2 of a semiconductor substrate 1, for example a silicon wafer, is partially covered with field oxide 3 in what is referred to as a LOCOS insulation process. Overlapping with the field oxide 3 (FOX), trenches 4 for the acceptance of capacitors of two neighboring memory cells are etched in a known fashion, whereby the FOX 3 insulates the cells from one another. The formation of a first electrode can be produced, for instance, by redoping the semiconductor substrate 1 in the region of the trench walls 4' (conventional trench capacitor; such a conventional trench capacitor is shown in the figures) or by insulating the trench walls 4' from the substrate 1 and by applying a conductive layer onto the trench walls 4' or, respectively, the insulation (STT cell). A dielectric as first layer 5 is applied or, formed by thermal oxidation of a silicon oxide layer on the first electrode, i.e. on the trench walls 4' in this example, and on the semiconductor surface 2. It is likewise known to a double or triple layer composed of silicon oxide (O) and silicon nitride (N) as a dielectric, i.e. layers of the type ONO, ON or NO.

Figure 2:
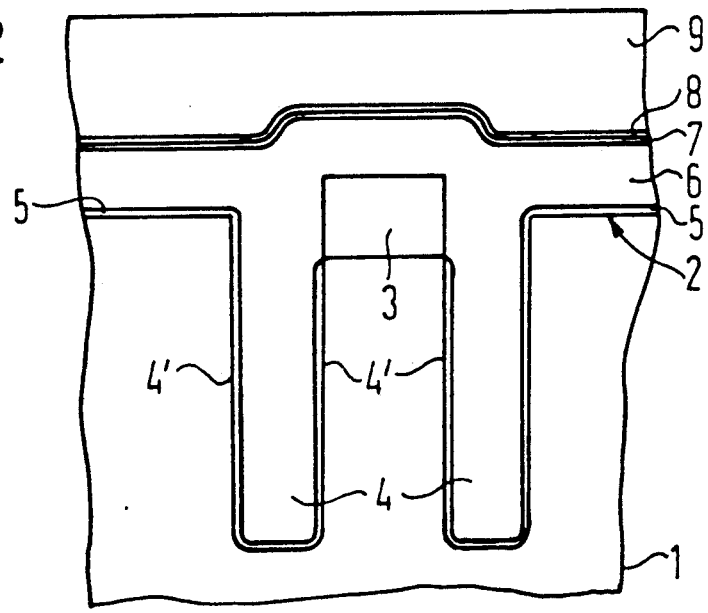

Regarding FIG. 2, a second layer 6 is applied on what is now the surface, i.e. on the dielectric 5 and on the FOX 3, this second layer 6 being, in particular, conductive and completely filling up the trenches 4. Polycrystalline silicon is preferably employed that is doped either during deposition in situ or is subsequently doped in a known way. As a result of the geometrical properties of the semiconductor substrate 1 treated in this way, the upper edge of the polysilicon 6 always lies higher above the FOX 3 than above the dielectric 5, i.e. the FOX-free region. This height difference amounts to 100 through 500 nm, whereby a value of 250 nm is typical. In a first embodiment of the method of the present invention that now follows, a third layer 7 and a fourth layer 8 are applied onto the polysilicon 6, these layers 7 and 8, in particular, being thin and having a function which will be set forth in greater detail below. Silicon oxide as the third layer 7 and silicon nitride or oxynitride as the fourth layer 8 are preferably employed, whereby the silicon nitride or oxynitride 8 is deposited in a CVD process and the silicon oxide 7 is formed by a thermal process. The two layers 7, 8 conform to the existing surface structure, their upper edges above the FOX 3 also lie higher than above the FOX-free locations. This property is utilized for the self-aligned method. The present invention further provides that a surface-wide auxiliary layer 9 is applied on the fourth layer 8, resulting in a leveling of the differences in surface height to a high degree. For example, photoresist or polyimide that are respectively applied in a thickness of 1 μm are suitable as the auxiliary layer 9.

Figure 3:
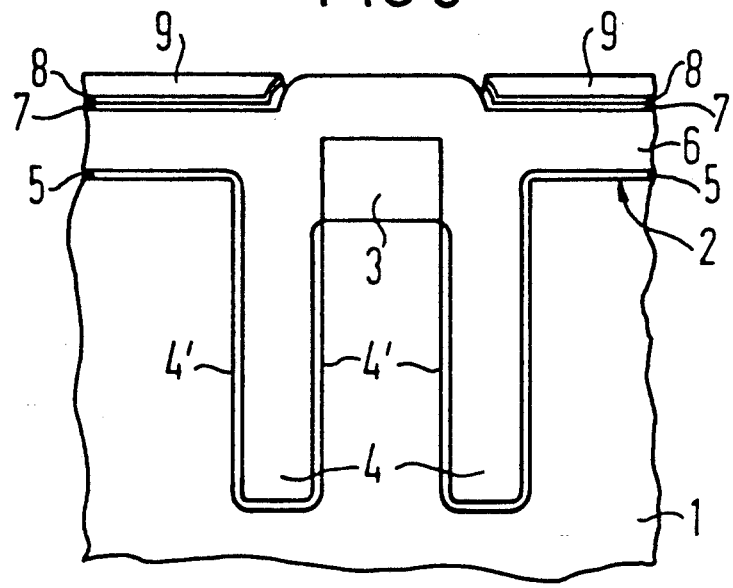

Regarding FIG. 3, the auxiliary layer 9 is removed surface-wide at least to such an extent that the raised locations of the underlying, fourth layer 8 on the FOX 3 are exposed. An anisotropic dry etching process is expediently used for this purpose, whereas the lacquer 9 over the FOX-free regions is not yet be removed at the end of the etching process. With, preferably, dry etching processes, the fourth layer 8 is then first removed at the exposed, raised locations and the exposed, raised locations of the third layer 7 are then subsequently removed.

Figure 4:
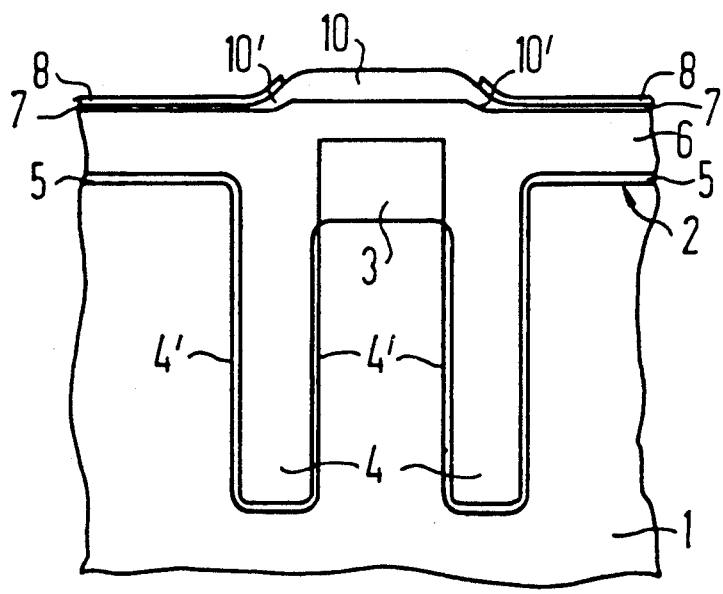

Regarding FIG. 4, the remaining residues of the auxiliary layer 9 over the FOX-free locations are completely removed. Subsequently, the exposed part of the second layer 6 composed of polysilicon is selectively oxidized in a known way, whereby the fourth layer 8 acts as an oxidation mask. As a result of the oxidation process, a sacrificial layer 10, 10' of silicon oxide is formed that, due to the lateral under-oxidation that occurs as known, has lateral regions 10' that extend under the fourth layer 8. This under-oxidation whose extent can be varied by the oxidation process within a certain scope can be utilized in order to enlarge the entire width of the oxide region 10, 10' so that, for example, the trenches 4 are completely covered. The necessary thickness of the sacrificial layer 10, 10' depends on the later etching process for the second layer; in this exemplary embodiment, it should amount to approximately 200 nm.

Regarding FIG. 5, the fourth layer 8 is removed first, followed by the third layer 7, whereby the sacrificial layer 10, 10' is thinned, as well, to a slight degree in this exemplary embodiment. The sacrificial layer 10, 10' is used as a mask for the self-aligned etching process that now follows. An anisotropic dry etching process is preferably utilized for this purpose, having an adequately high selectivity to the material of the sacrificial layer 10, 10', i.e. to the silicon oxide in this case. By adding polymerizing gases, positively tapered polysilicon side walls can also be produced, as shown in FIG. 5.

Positive tapered polysilicon side walls can also be achieved with an etching process that has an isotropic part and an anisotropic part; they then have a more or less pronounced, arcuate form.

Dependent on the lateral expanse of the masking sacrificial layer 10, 10', it is advantageous to set the etching process such that the second layer 6 (at least the lower edge thereof) still completely covers the trenches 4 on the one hand but, on the other hand, proceeds only slightly beyond them for minimizing the space requirement. As a result the capacitor terminal implantation plane can then be eliminated, as already set forth. That part of the polysilicon layer 6 that now still remains forms the common capacitor plate electrode of the capacitors using the self-aligned process of the present invention.

The polysilicon layer 6 is then still present wherever the original semiconductor surface 2 is covered with field oxide 3. Other than the region shown in FIGS. 1-5, this is the case, among other things, in the periphery of a semiconductor memory arrangement constructed of memory cells; and is also the case where word lines for driving the memory cells are arranged in standard, following method steps. It is advantageous to remove the parts of the polysilicon layer 6 situated therein that the sacrifical layer 10, 10' serving as the etching mask for polysilicon is removed at the disturbing locations (outside of the capacitor plate electrodes). This preferably already occurs before the structuring of the second layer to form the cooperating electrode. A phototechnique can be used for this purpose that need be adjusted with only slight precision. In this, a resist layer remains over the later capacitor plate electrodes as auxiliary plane 12, whereas the resist is removed in the development over those regions of the sacrificial layer 10, 10' that are to be removed, so that the sacrificial layer 10, 10' can etched away at those regions. This is schematically shown in FIG. 6 that shall be set forth in yet greater detail below. The exposed regions of the polysilicon layer 6 are thus etched away in the structuring of the polysilicon layer 6 to form the capacitor electrode, whereby the auxiliary level 12 was already previously removed.

FIG. 6 shows a plan view of the memory matrix having an advantageous geometrical arrangement of the memory cells. The trenches 4 of four neighboring memory cells are shown, as are the field oxide region 3, the aboveexplained auxiliary level 12 for the removal of polysilicon residues and word lines 11 formed in later method steps. The auxiliary level 10 covers the capacitor trenches 4 but not the field oxide region 3 at those locations over which the word lines 11 are placed; here, thus, the sacrificial layer 10, 10' and the second layer 6 are completely removed.

It may also be seen from FIG. 6 that the word lines 11 do not cover the capacitor plate electrode at any location. As a result thereof, first, the height differences between the word lines 11 are discussed, and the difficulties in their structuring are diminished. Second, an insulating layer between the cooperating electrode and word lines 11 can be omitted. What is needed for this purpose is what is referred to as an open bit line concept in the lay-out of the memory arrangement. Such an open bit line concept is set forth in detail in U.S Pat. No. 4,045,783 (hereby incorporated by reference) as prior art and is referred to therein as "conventional lay-out".

The following is in regards to further embodiments of the present invention.

The self-aligned method is based on the inventive idea of exploiting the height difference caused by the FOX 3. With the assistance of this geometrical property, a sacrificial layer 10, 10' is produced on the second layer 6, this sacrificial layer 10, 10' then acting as an etching mask for the capacitor plate electrode to be formed from the second layer 6. In addition to the above-explained embodiment of the method, further methods not shown in the figures are also suitable.

A first such method is selective deposition. After the removal of the remaining layer 9, the sacrificial layer 10 can be selectively deposited on the exposed, raised part of the second layer 6 (polysilicon) in FIG. 3. Selective polysilicon deposition or epitaxy as well as selective deposition of refractory metals or their silicides come into consideration for this purpose (for example, tungsten, molybdenum, tungsten silicide, tantalum silicide). The fourth layer 8 composed of silicon nitride is not required for this embodiment of the method of the present invention; no material is deposited on the oxide layer 7 as a consequence of the selectivity of the process.

Another method is non-selective deposition. Instead of a selective deposition, a non-selective deposition of metals can also be performed over the entire surface of the semiconductor substrate treated according to FIG. 3 (after removal of the layer 9). Metals are thereby used that form a silicide with the underlying polysilicon 6 in a subsequent silicidation process implemented in a known way (W, Ho, Ti, Pt, Co among others), whereas no reaction occurs with silicon nitride or oxide. The non-silicized metal can subsequently be selectively removed; this technique that is referred to as salicide technique is known, for example, from the article by S. Murarka and D. Fraser, Journal of Applied Physics 51 (1) 1980, page 342. As in the preceding exemplary embodiment, the fourth layer 8 can also be omitted.

The method of the present invention and the exemplary embodiments thereof are not limited to the manufacture of a capacitor plate electrode of a trench capacitor but can be transferred to other applications wherein an existing height difference can be utilized for a self-aligned manufacture of structures on semiconductor substrates by leveling with an auxiliary layer and subsequent, partial exposure of the surface by a reetching step.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. Method for manufacturing a trench capacitor of a one-transistor memory cell in a semiconductor substrate, comprising the steps of:

forming a trench overlapping with a field oxide that isolates various cells and forming a first capacitor electrode of the trench capacitor, manufacturing a first layer on a surface of the semiconductor substrate and on a surface of the first capacitor electrode;

applying a second layer on the first layer and on the field oxide, and applying at least a third layer on the second layer and applying a leveling auxiliary layer on the at least third layer;

removing the auxiliary layer at least until parts of at least the third layer are exposed, removing the exposed parts of the at least third layer at least until parts of the surface of the second layer are exposed;

completely removing the auxiliary layer to produce a sacrificial layer at least on the exposed part of the surface of the second layer;

completely removing the all remaining layers still situated on the surface of the second layer with the exception of the sacrificial layer, and structuring the second layer using the sacrificial layer as a mask to form a capacitor plate electrode of the trench capacitor.

2. Method according to claim 1, wherein one of a thermal or deposited silicon oxide is used as the first layer.

3. Method according to claim 1, wherein one of a double layer or a triple layer composed of silicon oxide and silicon nitride as constituents is used as the first layer.

4. Method according to claim 1, wherein a doped polycrystalline silicon layer is used as the second layer.

5. Method according to claim 1, wherein one of a thermal or deposited silicon oxide is used as the third layer.

6. Method according to claim 1, wherein one of a photoresist layer or a polyimide layer is used as the leveling auxiliary layer.

7. Method according to claim 1, wherein the structuring of the second layer is implemented using an essentially anisotropic etching process.

8. Method according to claim 7, wherein the anisotropic etching process has a polymerizing gas additive.

9. Method according to claim 1, wherein after the sacrificial layer is produced, a phototechnique layer is applied that covers at least the location of the capacitor plate electrode with resist to remove exposed parts of the sacrificial layer above the field oxide.

10. Method according to claim 1, wherein a fourth layer is deposited on the third layer before the leveling auziliary layer is applied.

11. Method according to claim 10, wherein one of silicon nitride or silicon oxynitride is used as the fourth layer.

12. Method according to claim 1, wherein at least the third layer is anisotropically and selectively etched relative to the second layer after the partial removal of the auxiliary layer that exposes at least parts of the third layer.

13. Method according to claim 1, wherein the sacrificial layer is produced by thermal oxidation of the second layer.

14. Method according to claim 13, wherein a lateral expanse of the sacrificial layer is set by the thermal oxidation.

15. Method according to claim 1, wherein the sacrificial layer is produced by selective deposition of one of polycrystalline silicon, a refractory metal or a metal silicide on the second layer.

16. Method according to claim 1, wherein the sacrificial layer is produced by selective epitaxy of polycrystalline silicon on the second layer.

17. Method according to claim 1, wherein the sacrificial layer is produced by surface-wide deposition of silicide-forming metals and by a subsequent silicidation process.

18. Method for manufacturing a trench capacitor of a one-transistor memory cell in a semiconductor substrate, comprising the steps of:
forming a trench overlapping with a field oxide that isolates various cells and forming a first capacitor electrode of the trench capacitor, manufacturing a first layer on a surface of the semiconductor substrate and on a surface of the first capacitor electrode;
applying a second layer on the first layer and on the field oxide, and applying third layer over the second layer and a fourth layer over the third layer and a leveling auxiliary layer over the fourth layer;
removing the auxiliary layer at least until parts of the fourth layer are exposed, removing the exposed part of the fourth layer and removing parts of the third layer that are under the exposed parts of the fourth layer at least until parts of the surface of the second layer are exposed;
completely removing the auxiliary layer to produce a sacrificial layer at least on the exposed part of the surface of the second layer;
completely removing the third and fourth layers still situated on the surface of the second layer with the exception of the sacrificial layer, and structuring the second layer using the sacrificial layer as a mask to form a capacitor plate electrode of the trench capacitor.

19. Method according to claim 18, wherein one of a thermal or deposited silicon oxide is used as the first layer.

20. Method according to claim 18, wherein one of a double layer or a triple layer composed of silicon oxide and silicon nitride as constituents is used as the first layer.

21. Method according to claim 18, wherein a doped polycrystalline silicon layer is used as the second layer.

22. Method according to claim 18, wherein one of a thermal or deposited silicon oxide is used as the third layer.

23. Method according to claim 18, wherein one of a photoresist layer or a polyimide layer is used as the leveling auxiliary layer.

24. Method according to claim 18, wherein the structuring of the second layer is implemented using an essentially anisotropic etching process.

25. Method according to claim 24, wherein the anisotropic etching process has a polymerizing gas additive.

26. Method according to claim 18, wherein after the sacrificial layer is produced, a phototechnique layer is applied that covers at least the location of the capacitor plate electrode with resist to remove exposed parts of the sacrificial layer above the field oxide.

27. Method according to claim 18, wherein one of silicon nitride or silicon oxynitride is used as the fourth layer.

28. Method according to claim 18, wherein the fourth and third layers are anisotropically and selectively etched relative to the second layer after the partial removal of the auxiliary layer that exposes at least parts of the underlying fourth layer.

29. Method according to claim 18, wherein the sacrificial layer is produced by thermal oxidation of the second layer.

30. Method according to claim 29, wherein a lateral expanse of the sacrificial layer is set by the thermal oxidation.

31. Method according to claim 18, wherein the sacrificial layer is produced by selective deposition of one of polycrystalline silicon, a refractory metal or a metal silicide on the second layer.

32. Method according to claim 18, wherein the sacrificial layer is produced by selective epitaxy of polycrystalline silicon on the second layer.

33. Method according to claim 18, wherein the sacrificial layer is produced by surface-wide deposition of silicide-forming metals and by a subsequent silicidation process.

* * * * *